United States Patent
Fryer et al.

[11] Patent Number: 6,107,789
[45] Date of Patent: Aug. 22, 2000

[54] CURRENT MIRRORS

[75] Inventors: Martin A. Fryer, Swindon; Dominic Charles Royce, Wokingham, both of United Kingdom

[73] Assignee: Lucent Technologies Inc., Murray Hill, N.J.

[21] Appl. No.: 09/416,033

[22] Filed: Oct. 12, 1999

[30] Foreign Application Priority Data

Oct. 15, 1998 [EP] European Pat. Off. .............. 98308431

[51] Int. Cl.[7] ........................................... G05F 3/16
[52] U.S. Cl. .......................................... 323/316; 323/315
[58] Field of Search ..................... 323/315, 316, 323/317; 330/257, 288; 327/535, 538, 561

[56] References Cited

U.S. PATENT DOCUMENTS

| | | | |
|---|---|---|---|
| 3,973,215 | 8/1976 | Ahmed | 330/51 |
| 4,544,878 | 10/1985 | Beale et al. | 323/315 |
| 5,113,129 | 5/1992 | Hughes | 323/316 |
| 5,612,614 | 3/1997 | Barrett, Jr. et al. | 323/316 |
| 5,734,293 | 3/1998 | Gross | 327/561 |
| 5,798,723 | 8/1998 | Fong | 341/136 |
| 5,867,012 | 2/1999 | Tuthill | 323/313 |

FOREIGN PATENT DOCUMENTS

| | | | |
|---|---|---|---|
| 0 373 471 A1 | 12/1989 | European Pat. Off. | G05F 3/26 |
| 0 760 555 A1 | 8/1995 | European Pat. Off. | H03F 3/345 |

OTHER PUBLICATIONS

European Search Report, dated Apr. 19, 1999.

*Primary Examiner*—Matthew Nguyen
*Attorney, Agent, or Firm*—John P. Veschi

[57] ABSTRACT

A current mirror suitable, for example, for a charge pump circuit comprises a reference device (21), an output device (22), a first amplifier (41), a follower amplifier (42), and switches (31, 32 43, 44). When switches 31 and 43 are closed, the current mirror is enabled and the low output impedance of follower (42) ensures that the gate voltage of output device (22) quickly equals the gate voltage of reference device (21), switching on the output quickly and accurately. When output device (22) is off, switch (44) closes, and the output of the first amplifier (41) bypasses the follower (42) so that the first amplifier (41) and the reference device (21) form a loop, and compensation becomes easier. The amplifiers (41, 42) are separately compensated to make them stable.

9 Claims, 8 Drawing Sheets

CURRENT MIRRORS

CROSS-REFERENCE TO RELATED APPLICATION

This application claims priority of European Patent Application No. 98308431.0, which was filed on Oct. 15, 1998.

BACKGROUND OF THE INVENTION

1. Field of the Invention

This invention relates to current mirrors and finds application, for example, in charge pump circuits.

2. Description of the Related Art

A conventional current mirror has an input or a reference device, which is usually diode-connected, and an output device. For increased accuracy the diode connection may be replaced by an amplifier which senses the voltages on the output electrodes of the reference and output devices and provides an output to the control electrodes of the devices.

Referring to FIG. 1, a simple current mirror comprises a reference device 1 (sometimes termed an input or logging device), and an output device 2. The devices shown are of the NMOS type, although it will be appreciated that other devices such as PMOS or bipolar devices may be employed. The drain of device 1 is connected to the gates of devices 1 and 2. The sources of devices 1 and 2 are connected to, in this case, ground. As will be appreciated, device 1 is diode-connected. The operation of such a current mirror is well known.

Referring now to FIG. 2, a current mirror having increased accuracy comprises a reference device 21, an output device 22, and an amplifier 23. Although devices 21 and 22 are shown as of the NMOS type, other devices may be used, such as PMOS or bipolar types. The sources of devices 21 and 22 are connected to, in this case, ground, and their gates are connected together. The drain of device 21 is connected to one input of amplifier 23. The drain of device 22 is connected to an output terminal OUT and to another input of amplifier 23. In operation, amplifier 23 senses the drain voltages of devices 21 and 22 and provides a control voltage to the gates of devices 21 and 22.

SUMMARY OF THE INVENTION

The present invention seeks to provide a current mirror suitable for use in, for example, a charge pump circuit.

According to this invention a current mirror comprises a reference device, an output device, each said device having first and second controlled electrodes and a control electrode, a first amplifier connected to receive input from the first controlled electrodes of the reference and output devices, means for disabling the output device, and means for coupling output from the first amplifier to the control electrode of the output device, the first amplifier being in a feedback loop between the first controlled electrode and the control electrode of the reference device.

Preferably the coupling means comprises a second amplifier connected to receive output from the first amplifier. Preferably the disabling means comprises a switch interposed between the output of the second amplifier and the control electrode of the output device. There may be provided means for selectively including the second amplifier in the feedback loop when the output device is enabled.

There may be provided a switch, in a loop comprising the first amplifier and the output device, for opening the loop. There may be provided a capacitor connected for storing the signal at the output of the first amplifier when the loop is open. There may be provided a switch for coupling one side of the capacitor to a predetermined voltage when the reference and output devices are substantially nonconductive.

There may be provided means for connecting the first controlled and control electrodes of the reference device together in response to the voltage on the first controlled electrode of the output device exceeding a predetermined level. The connecting means may comprise a comparator for comparing the said voltage exceeding said predetermined level, and a switch for connecting the first controlled and control electrodes of the reference device together in response to said predetermined output.

BRIEF DESCRIPTION OF THE DRAWINGS

In the various figures like references denote like parts.

DETAILED DESCRIPTION

Figure 1:
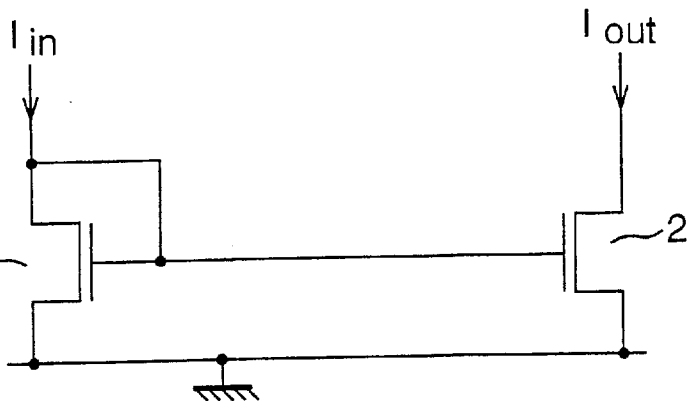
FIG. 1 is a simplified circuit diagram of a known current mirror.
Figure 2:
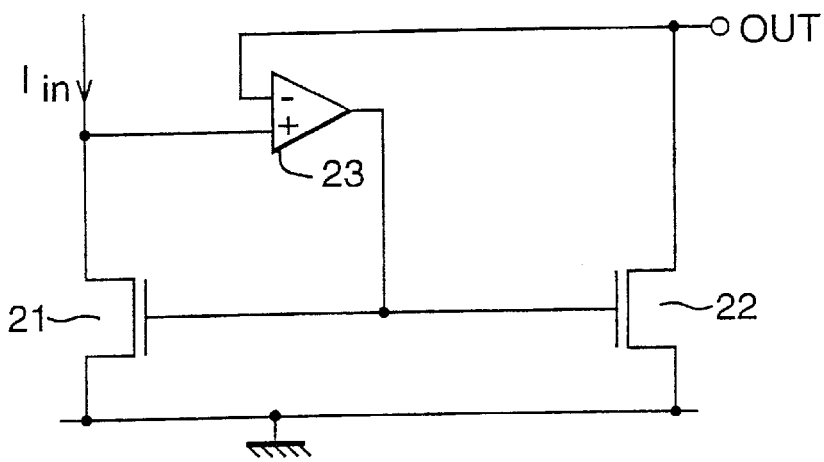
FIG. 2 is a circuit diagram of an amplifier current mirror.
Figure 3:
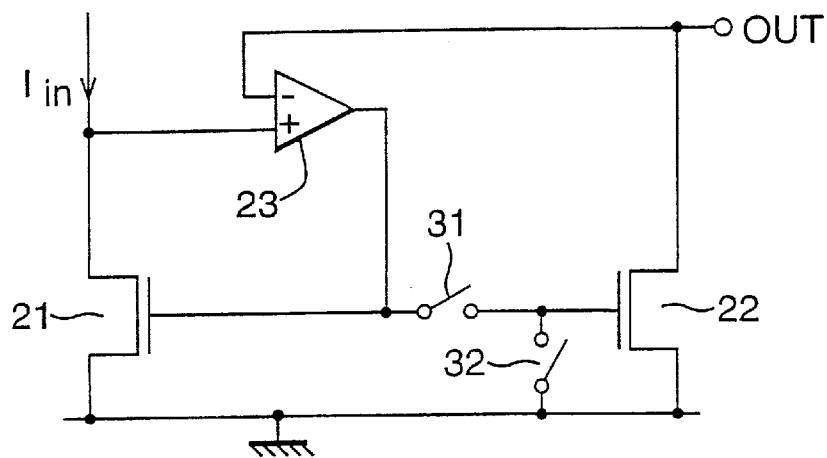
FIG. 3 is a circuit diagram of a current mirror embodying the invention.

FIG. 3 is a circuit diagram of an embodiment of the invention comprising the current mirror of FIG. 2 adapted for use in a charge pump circuit by the inclusion of means for disabling the output device 22. The disabling means in the form of, for example, a switch 31 may be placed in any of the electrode circuits of device 22, but preferably it is included, as shown, between the output of amplifier 23 and the gate of device 22. In operation, when switch 31 is closed device 22 becomes operative to provide an output current. When switch 31 opens the output current ceases. As will be appreciated by those skilled in the art, switch 31 may be controlled by means (not shown) so that the current mirror provides a succession of output current pulses. A switch 32, which is normally open when switch 31 is closed, serves to connect the otherwise floating gate of device 22 to ground when switch 31 is open.

Amplifier 23 must have an extremely low output impedance to switch output device 22 quickly, and the larger device 22 is, the more onerous is this requirement. Amplifier 23 will usually therefore have a large gain or several stages. This type of amplifier is usually more difficult to keep stable.

Figure 4A:
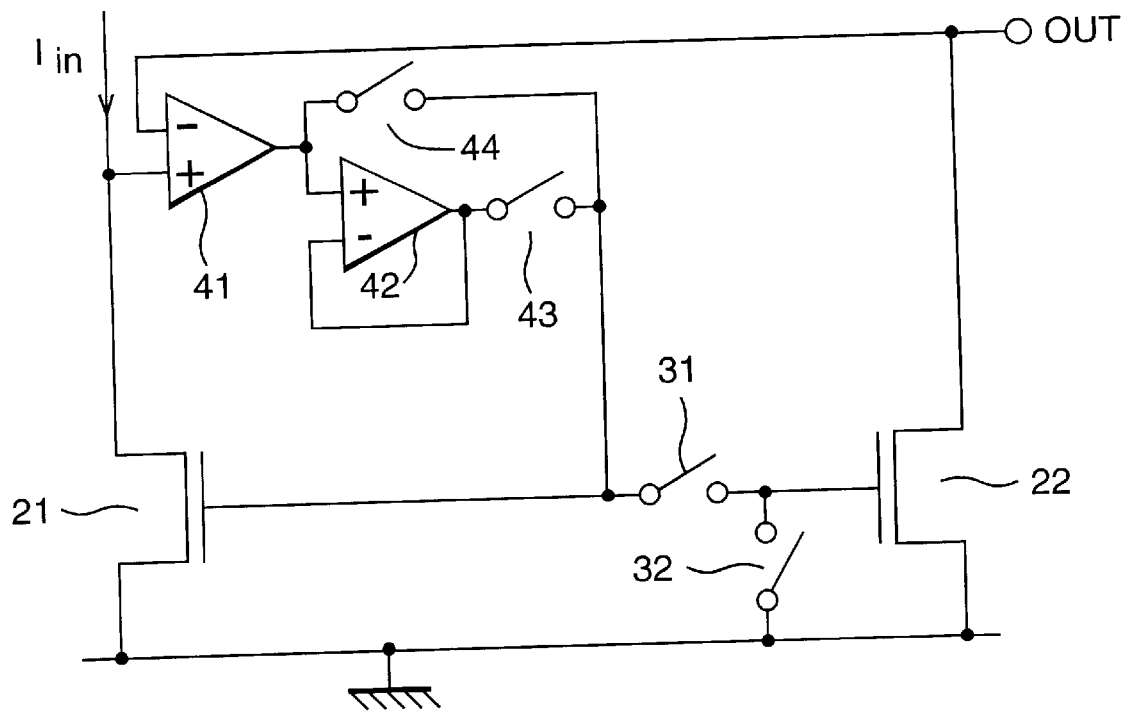
FIGS. 4a and 4b are circuit diagrams of further current mirrors embodying the invention.

To ameliorate this problem, and referring now to FIG. 4a, a current mirror embodying the invention has two amplifiers, 41 and 42, each of which is separately compensated. Amplifier 42 may be a unity gain stage, or follower, which provides a low output impedance. A switch 43 connects the output of amplifier 42 to switch 31, and another switch, 44, is provided to directly connect the output of amplifier 41 to the gate of device 21. In operation, when switches 31 and 43 are closed, the low output impedance of the follower 42 ensures that the gate voltage of device 22 quickly equals the gate voltage of reference device 21, thereby switching the output on more quickly and more accurately. When the output device 22 is disabled, i.e., when switch 31 is open, switch 43 also opens and switch 44 closes. The operation of switch 32 is as described with reference to FIG. 3. When the output device 22 is off, the output of amplifier 41 bypasses the follower 42. Amplifier 41 and reference device 21 thus form a loop which must be kept stable. By keeping the follower out of this loop, the loop gain is reduced and compensation becomes easier.

Figure 4B:
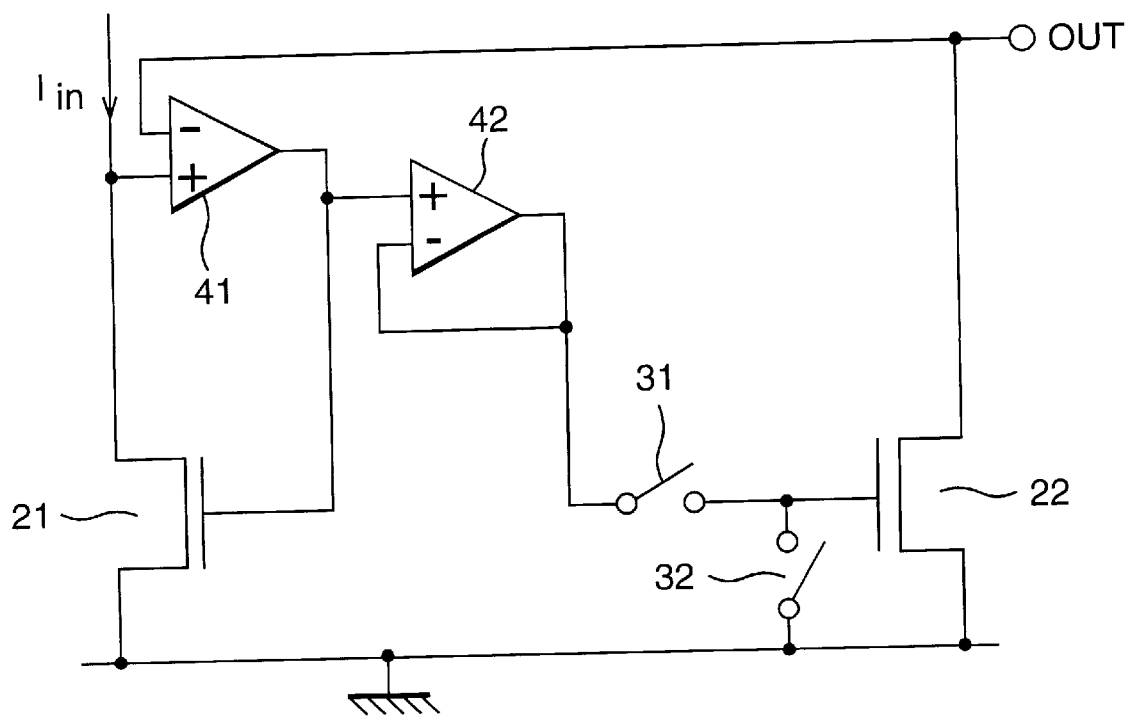

In an alternative embodiment shown in FIG. 4b, the output of amplifier 41 is fed directly to the gate of reference device 21 so that follower 42 is not in the loop comprising amplifier 41 and reference device 21. In this embodiment follower 42 does not require switches 43 and 44 and their associated connections. Apart from these differences, the current mirror of FIG. 4b operates in a similar manner to that described with reference to FIG. 4a.

In FIGS. 4a and 4b, when the output device is switched on the output voltage may change, and, as the output voltage is an input to the first amplifier 41, the output voltage of this amplifier may also change. This may result in a change in the output current. It will be appreciated that the loop formed by output device 22, first amplifier 41 and follower amplifier 42 may be unstable, especially as the circuit (not shown) connected to OUT is unknown. To avoid this potential problem, a sample and hold circuit may be added to the circuits of FIGS. 4a and 4b, the resulting circuits being shown in FIGS. 5a and 5b respectively.

Figure 5A:
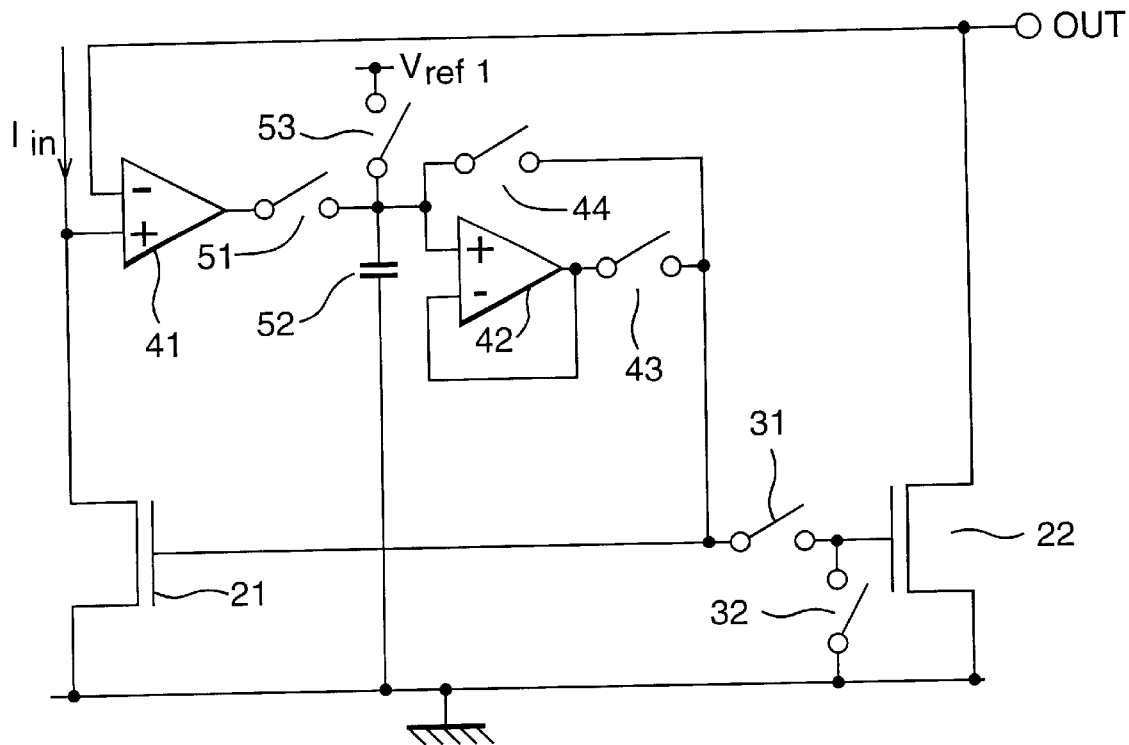
FIGS. 5a and 5b are circuit diagrams of the current mirrors of FIGS. 4a and 4b, respectively, and including a sample and hold circuit.
Figure 5B:
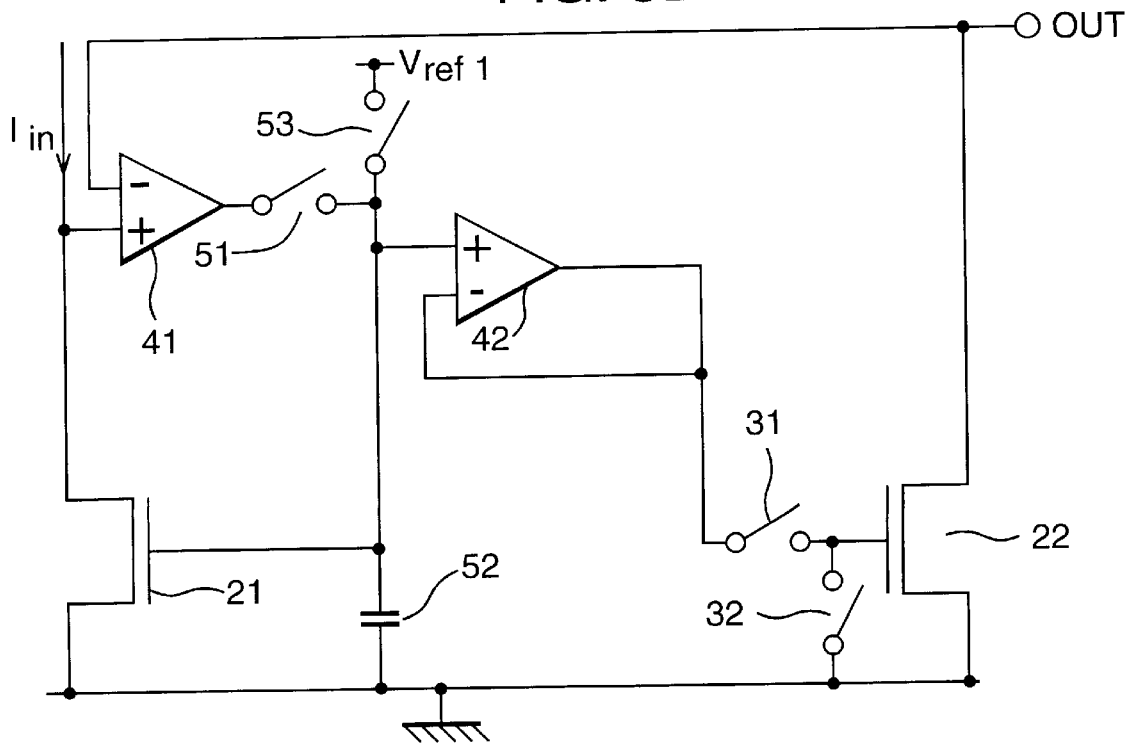

Referring now to FIGS. 5a and 5b, a sample and hold switch 51 is interposed between the output of amplifier 41 and an input of follower 42. When output device 22 is on, switch 51 is open, thus breaking the loop containing amplifiers 41 and 42 and output device 22. When output device 22 is disabled, i.e., when switch 31 is open, switch 51 is closed to enable the output of amplifier 41 to be stored in a hold capacitor 52. Switch 51 should be opened before switch 31 is closed, to ensure that the loop is not closed. If switch 51 is the first switch in the turn-on sequence to be changed, then the hold capacitor 52 prevents most subsequent switching noise from affecting the output current. It will be appreciated that the loop containing amplifiers 41 and 42 and output device 22 is never closed, and thus will be stable. A power down switch 53 serves to connect hold capacitor 52 to a suitable reference voltage, V ref 1, during power down, i.e., when reference device 21 and output device 22 are substantially nonconductive. This enables fast power up to the correct voltage at start up of the current mirror. Because the loop containing amplifier 41 and reference device 21 is broken when in the hold mode, hold capacitor 52 may also be the compensation capacitor for amplifier 41. The operation of the circuits FIGS. 5a and 5b is, apart from the addition of the sample and hold circuit, as already described with reference to FIGS. 4a and 4b, respectively.

Referring again to FIGS. 4a and 4b, the circuit (now shown) which feeds reference device 21 is usually imperfect, i.e., its output current will tend to change if the voltage across it becomes too small. Amplifiers 41 and 42 attempt to force almost identical voltages on to the drains of the reference and output devices 21 and 22. However, if the output voltage exceeds a predetermined level, i.e., in this case if the output voltage becomes close to the opposite supply voltage (opposite to the voltage on the sources of the reference and output devices) then the current feeding the reference device 21 may change substantially, and the output current will be incorrect. Furthermore, if at start up of the circuit the output voltage at OUT exceeds the predetermined level, again, in this case, if it becomes close to the opposite supply voltage, amplifiers 41 and 42 may force the drain of the reference device to a similar voltage, and the circuit may "lock up" in this undesired state with no current flow. It will be appreciated that these problems are likely to occur only when output device 22 is off.

Figure 6A:
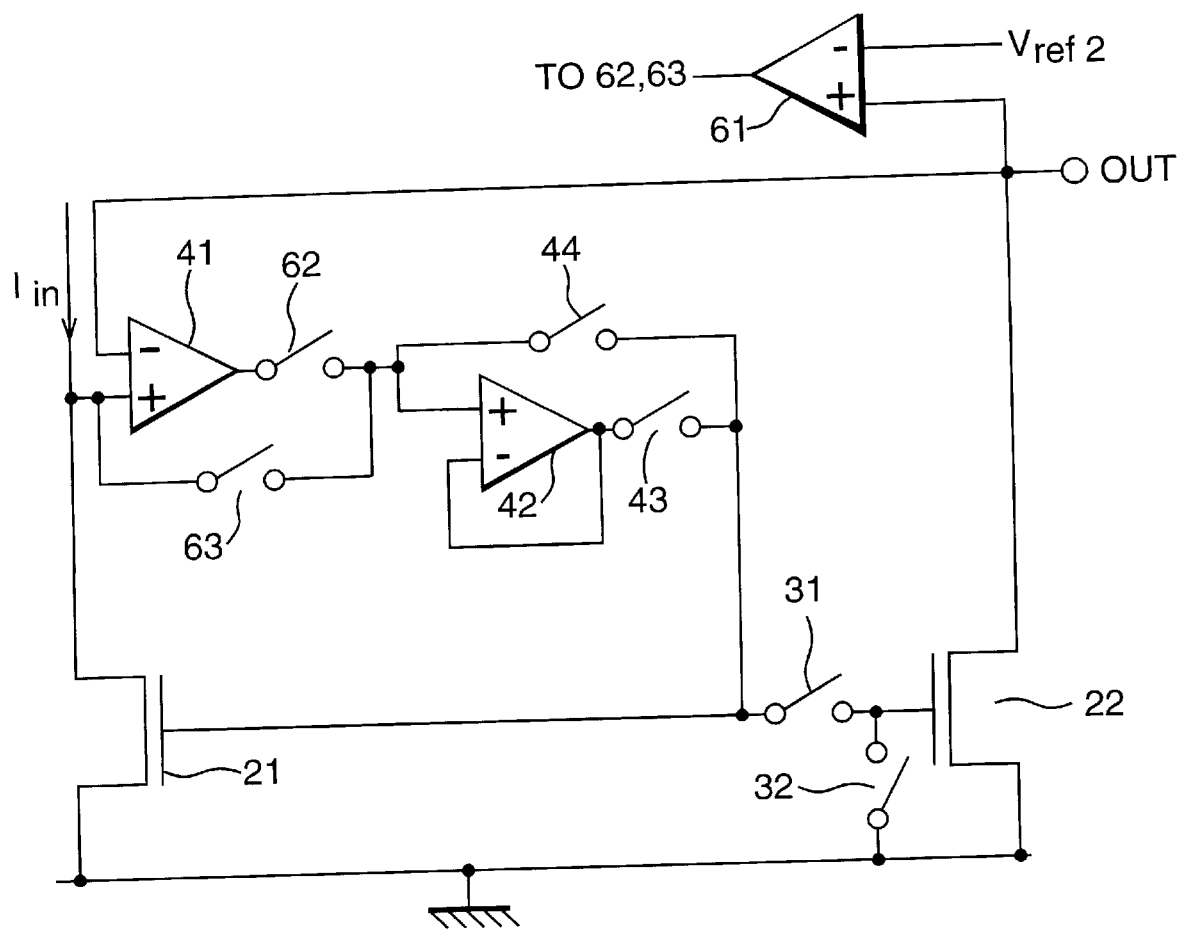
FIGS. 6a and 6b are circuit diagrams of the current mirrors of FIGS. 4a and 4b, respectively, and including a so-called end detector.
Figure 6B:
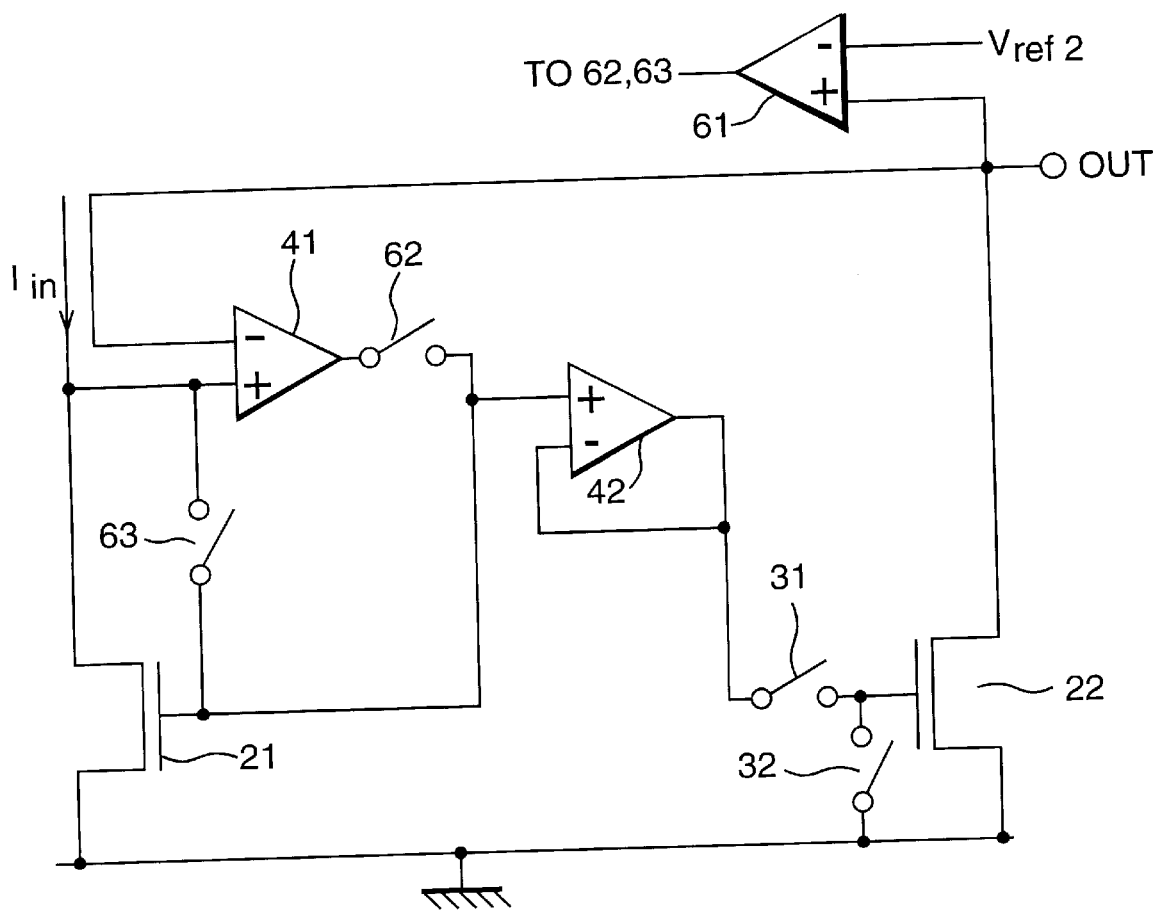

FIGS. 6a and 6b show FIGS. 4a and 4b, respectively, with additional components to overcome these problems.

Referring now to FIG. 6a a so-called end detector, or comparator, 61 has one input connected to the terminal OUT and another input connected to a voltage reference source V ref 2. The output of amplifier 41 is connected via a normally-closed switch 62 to an input of amplifier 42, and this same input is connected via a normally-open switch 63 to the drain of reference device 21. Normal operation of the current mirror is as has been described with reference to FIG. 4a. However, in response to the output voltage at OUT exceeding the predetermined level referred to above, comparator 61 changes state and opens normally-closed switch 62 and closes normally-open switch 63, thereby connecting the drain of reference device 21 via switches 63 and 44 to the gate of reference device 21, so that the reference device 21 is, in effect, diode connected. Although the output current will not now be so accurate, this inaccuracy occurs at an extreme of the output voltage range. This arrangement also overcomes the start up problem noted above.

With reference to FIG. 6b, a normally-closed switch 62 connects the output of amplifier 41 to an input of follower 42, and a normally-open switch 63 is connected between the drain and gate of reference device 21. Operation is similar to that described with reference to FIG. 6a in that comparator 61, in response to the voltage at OUT exceeding the predetermined level, opens normally closed switch 62 and closes normally-open switch 63 whereby the circuit reverts, in effect, to the diode connected mode.

In both FIGS. 6a and 6b switch 62 may be omitted if the output current capacity of amplifier 41 is substantially weaker than the current $l_{in}$ in the reference device 21.

As described, the predetermined level at which comparator 61 changes state is set at or near the opposite supply voltage because, for the exemplary circuits described, the current feeding the reference device may change substantially, or "lock up" may occur at start up of the circuit, when the output voltage becomes close to the opposite supply voltage. As will be appreciated, however, the predetermined level at which comparator 61 changes state may alternatively be selected to correspond to any output voltage at which either or both of these undesirable effects occurs.

Figure 7A:
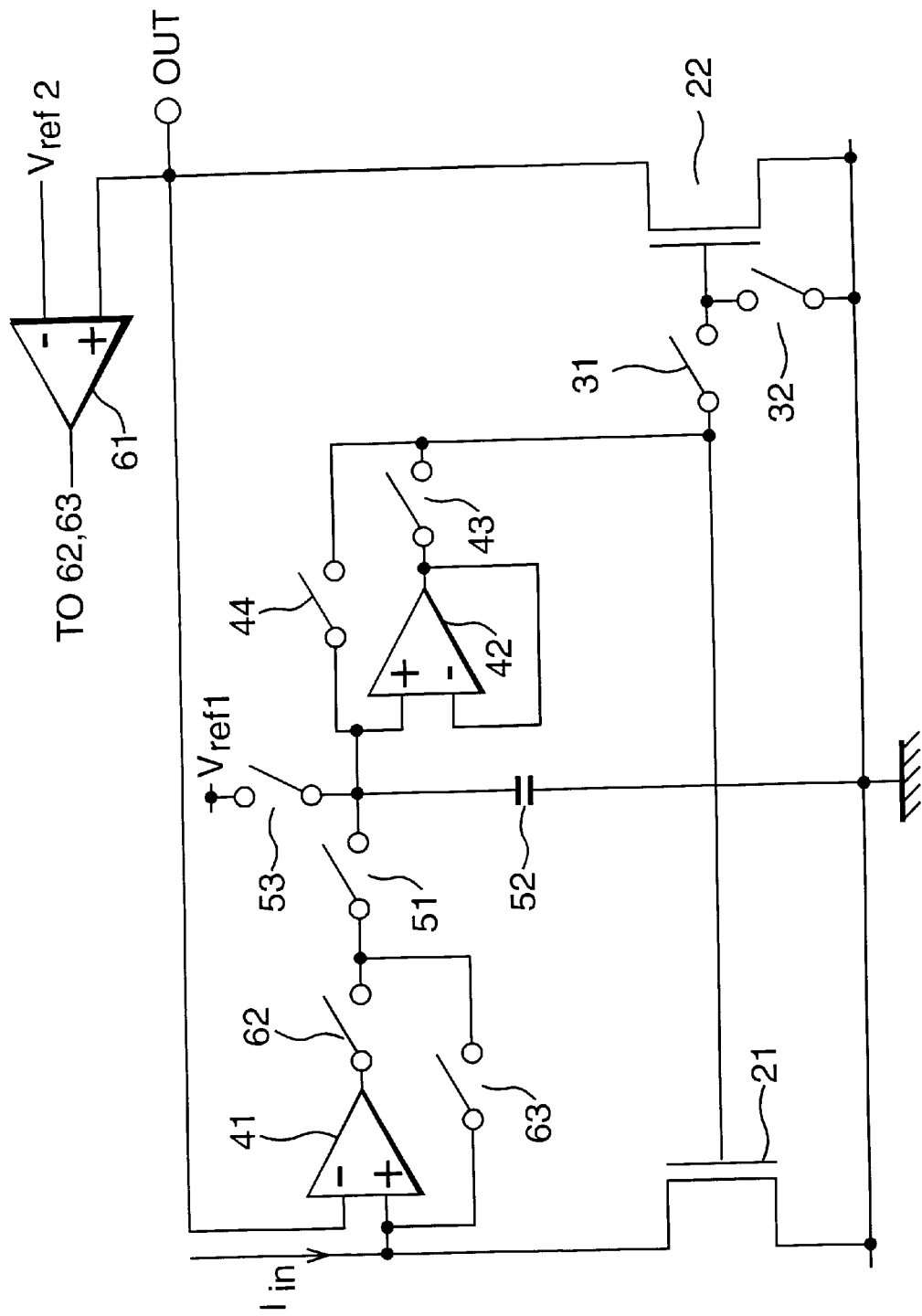
FIGS. 7a and 7b are circuit diagrams of the current mirrors of FIGS. 4a and 4b, respectively, and including a sample and hold circuit and an end detector.
Figure 7B:
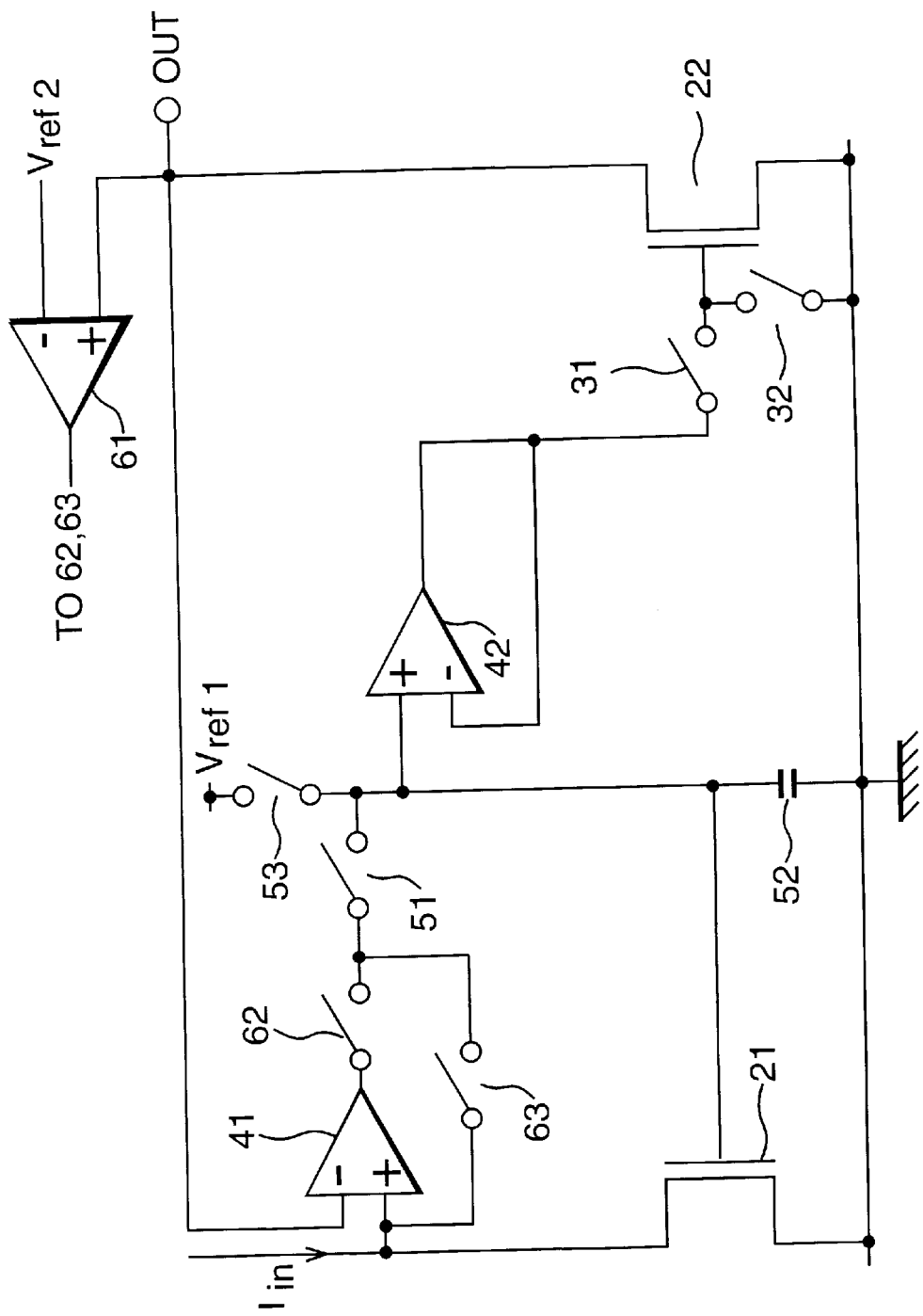

FIGS. 7a and 7b are included for the sake of completeness. FIG. 7a shows the current mirror of FIG. 4a including the additional circuitry of FIGS. 5a and 6a. FIG. 7b shows the current mirror of FIG. 4b including the additional circuitry of FIGS. 5b and 6b. It will be noted in FIG. 7b that, in contrast to FIG. 6b, switch 63 is connected between the drain and gate of reference device 21 via sample and hold switch 51. The operation of the circuits shown in FIGS. 7a and 7b will be clear to those skilled in the art having regard to the descriptions already given with reference to FIGS. 4a, 4b, 5a, 5b, 6a and 6b, and will not be described further.

As will be appreciated by those skilled in the art, the various switches, the amplifiers, and the comparator may take a variety of forms. Furthermore, the design of any necessary control or logic circuitry to control the operation of the various switches will be readily apparent to those skilled in the art.

Figure 8:
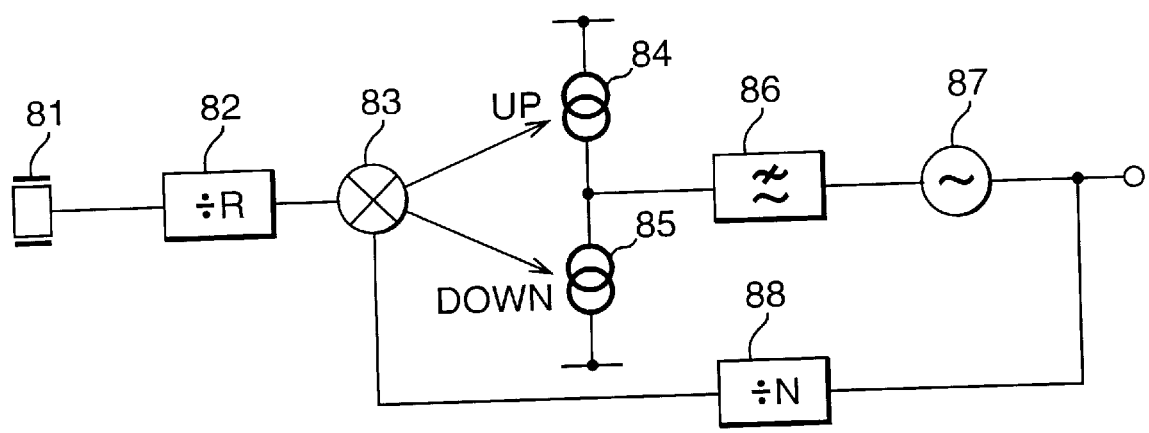
FIG. 8 is a schematic block diagram of a phase lock loop in which the present invention may be employed.

Referring now to FIG. 8, a phase lock loop in which embodiments of the invention may be employed includes a crystal oscillator 81 whose output feeds a reference divider 82 the output of which is fed as one input to a phase comparator 83. The other input of phase comparator 83 is provided by the output of a divider 88 whose input is fed by the output of a voltage controlled oscillator 87. The control voltage for controlling the frequency of the oscillator 87 is developed by charge pumps 84 and 85 one of which, 84, serves to increase the control voltage, and the other of which, 85, serves to decrease the control voltage in dependence upon the output of phase comparator 83. Each charge pump 84 and 85 comprises a respective current mirror embodying the invention, each being arranged with the appropriate supply voltage polarities etc. to provide the respective increasing or decreasing control voltage, as will be apparent to those skilled in the art. Output from the charge pumps 84 and 85 is smoothed by a low pass filter 86 prior to application to the voltage controlled oscillator 87. The frequency of the output of oscillator 87 is determined, as is well known in the art, by the frequency of crystal oscillator 81 and the divider ratios of dividers 82 and 88.

What is claimed is:

1. A current mirror comprising a reference device, an output device, each said device having first and second controlled electrodes and a control electrode, a first amplifier connected to receive input from the first controlled electrodes of the reference and output devices, means for disabling the output device, and means for coupling output from the first amplifier to the control electrode of the output device, the first amplifier being in a feedback loop between the first controlled electrode and the control electrode of the reference device.

2. A current mirror as claimed in claim 1 wherein the coupling means comprises a second amplifier connected to receive output from the first amplifier.

3. A current mirror as claimed in claim 2 wherein the disabling means comprises a switch interposed between the output of the second amplifier and the control electrode of the output device.

4. A current mirror as claimed in claim 2 comprising means for selectively including the second amplifier in the feedback loop when the output device is enabled.

5. A current mirror as claimed in claim 1 comprising a switch, in a loop comprising the first amplifier and the output device, for opening the loop.

6. A current mirror as claimed in claim 5 comprising a capacitor connected for storing the signal at the output of the first amplifier when the loop is open.

7. A current mirror as claimed in claim 6 comprising a switch for coupling one side of the capacitor to a predetermined voltage when the reference and output devices are substantially non-conductive.

8. A current mirror as claimed in claim 1 comprising means for connecting the first controlled and control electrodes of the reference device together in response to the voltage on the first controlled electrode of the output device exceeding a predetermined level.

9. A current mirror as claimed in claim 8 wherein the connecting means comprises a comparator for comparing the said voltage and a reference voltage to provide a predetermined output in response to said voltage exceeding said predetermined level, and a switch for connecting the first controlled and control electrodes of the reference device together in response to said predetermined output.

* * * * *